(12) United States Patent
Mun et al.

(10) Patent No.: US 10,531,599 B2
(45) Date of Patent: *Jan. 7, 2020

(54) ELECTROMAGNETIC INTERFERENCE SHIELDING STRUCTURE

(71) Applicant: Samsung Electronics Co., Ltd., Suwon-si, Gyeonggi-do (KR)

(72) Inventors: Il-ju Mun, Suwon-si (KR); Keon Kuk, Yongin-si (KR); Kyong-il Kim, Yongin-si (KR); Jin-woo Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/124,836

(22) Filed: Sep. 7, 2018

(65) Prior Publication Data

US 2019/0082562 A1 Mar. 14, 2019

(30) Foreign Application Priority Data

Sep. 8, 2017 (KR) .......................... 10-2017-0115357

(51) Int. Cl.
*H05K 9/00* (2006.01)
*H05K 1/18* (2006.01)
*H05K 7/20* (2006.01)

(52) U.S. Cl.
CPC ........... *H05K 9/0028* (2013.01); *H05K 1/181* (2013.01); *H05K 7/20445* (2013.01); *H05K 2201/10371* (2013.01); *H05K 2201/10969* (2013.01)

(58) Field of Classification Search
USPC .................................................. 361/760, 761
See application file for complete search history.

(56) References Cited

U.S. PATENT DOCUMENTS

| 5,436,203 | A | 7/1995 | Lin |
| 5,641,438 | A | 6/1997 | Bunyan et al. |
| 5,650,659 | A | 7/1997 | Mostafazadeh et al. |
| 5,761,053 | A | 6/1998 | King et al. |

(Continued)

FOREIGN PATENT DOCUMENTS

| CN | 101785097 A | 7/2010 |
| EP | 2 187 435 A1 | 5/2010 |

(Continued)

OTHER PUBLICATIONS

Kim et al.; Onset condition of pulsating cone-jet mode of electrohydrodynamic jetting for plane, hole, and pin type electrodes; Journal of Applied Physics; Introducing Invited Perspectives; Ultrafast magnetism and THz spitronics; Nov. 24, 2010; vol. 108; American Institute of Physics; Seoul, KR.

(Continued)

*Primary Examiner* — Andargie M Aychillhum
(74) *Attorney, Agent, or Firm* — Jefferson IP Law, LLP

(57) ABSTRACT

An electromagnetic interference shielding structure is provided. The electromagnetic interference shielding structure includes a shield pad and a shield can. The shield pad is configured to surround at least one circuit element mounted on a printed circuit board, and to be grounded to a ground pad formed on a printed circuit board. The shield can include an upper plate, and a sidewall extending from the upper plate and partly embedded in the shield pad.

18 Claims, 27 Drawing Sheets

(56) References Cited

U.S. PATENT DOCUMENTS

| | | |
|---|---|---|
| 6,092,281 A | 7/2000 | Glenn |
| 6,150,193 A | 11/2000 | Glenn |
| 6,263,564 B1 | 7/2001 | Holmberg et al. |
| 6,297,551 B1 | 10/2001 | Dudderar et al. |
| 6,466,174 B2 | 10/2002 | Haussler et al. |
| 6,601,293 B1 | 8/2003 | Glenn |
| 6,933,894 B2 | 8/2005 | Ghosh et al. |
| 6,962,829 B2 | 11/2005 | Glenn et al. |
| 7,015,869 B2 | 3/2006 | Marlow et al. |
| 7,141,869 B2 | 11/2006 | Kim et al. |
| 7,196,275 B2 | 3/2007 | Babb et al. |
| 7,311,937 B2 | 12/2007 | Hashimoto |
| 7,482,686 B2 | 1/2009 | Zhao et al. |
| 7,633,015 B2 | 12/2009 | Wurzel et al. |
| 7,752,751 B2 | 7/2010 | Kapusta et al. |
| 7,981,730 B2 | 7/2011 | Tang et al. |
| 8,071,893 B2 | 12/2011 | Lin et al. |
| 8,276,268 B2 | 10/2012 | Kapusta et al. |
| 8,314,485 B2 | 11/2012 | Ono et al. |
| 8,633,403 B2 | 1/2014 | Lin et al. |
| 8,881,387 B2 | 11/2014 | Lin et al. |
| 8,971,553 B2 | 3/2015 | Takaoka |
| 9,192,057 B2 | 11/2015 | Malek et al. |
| 9,572,264 B2 | 2/2017 | Yamamoto et al. |
| 9,640,858 B1 | 5/2017 | Islam et al. |
| 9,768,154 B2 | 9/2017 | Tomonari et al. |
| 2001/0033478 A1 | 10/2001 | Ortiz et al. |
| 2004/0087043 A1 | 5/2004 | Lee et al. |
| 2004/0231872 A1 | 11/2004 | Arnold et al. |
| 2005/0045358 A1* | 3/2005 | Arnold .......... H05K 9/0024 174/51 |
| 2005/0280139 A1 | 12/2005 | Zhao et al. |
| 2007/0030661 A1 | 2/2007 | Morris et al. |
| 2007/0176281 A1 | 8/2007 | Kim et al. |
| 2007/0187136 A1 | 8/2007 | Higashiguchi et al. |
| 2007/0230131 A1 | 10/2007 | Bunyan et al. |
| 2008/0044744 A1 | 2/2008 | Yamazaki et al. |
| 2008/0292846 A1 | 11/2008 | Muranaga |
| 2009/0244876 A1 | 10/2009 | Li et al. |
| 2009/0244878 A1 | 10/2009 | Wurzel et al. |
| 2010/0045181 A1 | 2/2010 | Oh et al. |
| 2010/0188292 A1 | 7/2010 | Rutfors |
| 2010/0200983 A1 | 8/2010 | Ono et al. |
| 2010/0230789 A1 | 9/2010 | Yorita et al. |
| 2010/0327431 A1 | 12/2010 | Touzelbaev et al. |
| 2011/0006106 A1 | 1/2011 | Kanryo et al. |
| 2012/0023743 A1 | 2/2012 | Lin et al. |
| 2012/0104571 A1 | 5/2012 | Yoo |
| 2012/0218727 A1 | 8/2012 | Kim |
| 2012/0320558 A1 | 12/2012 | Foster et al. |
| 2013/0083501 A1* | 4/2013 | Azzopardi .......... B81C 1/00269 361/757 |
| 2013/0114228 A1 | 5/2013 | Merz et al. |
| 2013/0241039 A1 | 9/2013 | Choi et al. |
| 2013/0286609 A1 | 10/2013 | Merz |
| 2014/0002310 A1 | 1/2014 | Kim |
| 2014/0071634 A1 | 3/2014 | Pakula et al. |
| 2014/0126157 A1 | 5/2014 | Sawatari et al. |
| 2014/0160699 A1 | 6/2014 | Zhang et al. |
| 2014/0198459 A1 | 7/2014 | Cheng |
| 2014/0271961 A1 | 9/2014 | Khoshnevis |
| 2015/0016066 A1 | 1/2015 | Shimamura et al. |
| 2015/0022978 A1 | 1/2015 | Steuer et al. |
| 2015/0022986 A1 | 1/2015 | Steuer et al. |
| 2015/0036297 A1 | 2/2015 | Chen et al. |
| 2015/0043189 A1 | 2/2015 | Kitazaki et al. |
| 2015/0070851 A1 | 3/2015 | Kitazaki et al. |
| 2015/0214602 A1 | 7/2015 | Hobson et al. |
| 2016/0066481 A1 | 3/2016 | Malek et al. |
| 2016/0066482 A1 | 3/2016 | Chi et al. |
| 2016/0091575 A1 | 3/2016 | Yamada et al. |
| 2016/0157392 A1 | 6/2016 | Happoya |
| 2016/0262292 A1 | 9/2016 | Kuk et al. |
| 2017/0117615 A1 | 4/2017 | Choon et al. |
| 2017/0251549 A1 | 8/2017 | Lee et al. |
| 2017/0295679 A1 | 10/2017 | Kim et al. |
| 2017/0325365 A1 | 11/2017 | Kuk et al. |
| 2018/0116078 A1 | 4/2018 | Mun et al. |

FOREIGN PATENT DOCUMENTS

| | | |
|---|---|---|
| EP | 3 266 043 A1 | 1/2018 |
| JP | 6-283883 A | 10/1994 |
| JP | 2001-251088 A | 9/2001 |
| JP | 2004-048762 A | 2/2004 |
| JP | 2011-124598 A | 6/2011 |
| JP | 2011-146779 A | 7/2011 |
| JP | 2015-065343 A | 4/2015 |
| JP | 2016111026 A | 6/2016 |
| KR | 10-0321429 B1 | 3/2002 |
| KR | 10-2006-0083770 A | 7/2006 |
| KR | 10-0618085 B1 | 8/2006 |
| KR | 10-0742098 B1 | 7/2007 |
| KR | 10-2010-0064008 A | 6/2010 |
| KR | 10-2012-0127852 A | 11/2012 |
| KR | 10-2014-0111739 A | 9/2014 |
| KR | 10-2014-0132880 A | 11/2014 |
| KR | 10-1579623 B1 | 12/2015 |
| KR | 10-2016-0031572 A | 3/2016 |
| KR | 10-2016-0044953 A | 4/2016 |
| KR | 10-2016-0045336 A | 4/2016 |
| KR | 10-2016-0108117 A | 9/2016 |
| KR | 20160108117 A | 9/2016 |
| KR | 10-2017-0125690 A | 11/2017 |
| KR | 10-2018-0087551 A | 8/2018 |
| KR | 10-2018-0101831 A | 9/2018 |
| WO | 2004/047510 A2 | 6/2004 |
| WO | 2005/029937 A1 | 3/2005 |
| WO | 2016/144039 A1 | 9/2016 |
| WO | 2017/111956 A1 | 6/2017 |
| WO | 2017/191888 A1 | 11/2017 |

OTHER PUBLICATIONS

Baek et al.; 3D Printing Process for Mass Production of PCB Component; Best Paper Award 2015; Samsung; Seoul, KR.

Chinese Office Action dated Jun. 27, 2019, issued in the Chinese Application No. 201780028105.X.

Chinese Office Action dated Jul. 22, 2019, issued in the Chinese Application No. 201680014167.0.

U.S. Office Action dated Apr. 10, 2019, issued in the U.S. Appl. No. 15/488,024.

U.S. Notice of Allowance dated Oct. 5, 2018, issued in U.S. Appl. No. 15/489,190.

International Search Report and Written Opinion dated Oct. 22, 2018, issued in International Application No. PCT/KR2018/007746.

U.S. Notice of Allowance dated Oct. 30, 2018, issued in U.S. Appl. No. 15/386,823.

U.S. Non-final Office Action dated Nov. 8, 2018, issued in U.S. Appl. No. 15/488,024.

U.S. Non-final Office Action dated Nov. 29, 2018, issued in U.S. Appl. No. 15/061,233.

International Search Report and Written Opinion dated Dec. 17, 2018, issued in International Application No. PCT/KR2018/010501.

Extended European Search Report dated Feb. 12, 2019, issued in the European Patent Application No. 17792791.0.

U.S. Office Action dated Jul. 19, 2019, issued in the U.S. Appl. No. 16/020,386.

U.S. Office Action dated Aug. 9, 2019, issued in the U.S. Appl. No. 15/061,233.

\* cited by examiner

ELECTROMAGNETIC INTERFERENCE SHIELDING STRUCTURE

CROSS-REFERENCE TO RELATED APPLICATION(S)

This application is based on and claims priority under 35 U.S.C. § 119 of a Korean patent application number 10-2017-0115357, filed on Sep. 8, 2017, in the Korean Intellectual Property Office, the disclosure of which is incorporated by reference herein in its entirety.

BACKGROUND

1. Field

The disclosure relates to devices and methods consistent with what is disclosed herein relate to an electromagnetic interference shielding structure. More particularly, the disclosure relates to an electromagnetic interference shielding structure for shielding electromagnetic waves radiated from various types of circuit elements included in a package and protecting the circuit elements from external environment.

2. Description of Related Art

Recently, a demand for a portable device has been rapidly increased in the electronic product market, and slimming and miniaturizing of electronic components mounted on portable devices have been continuously in demand. In order to realize the slimming and miniaturizing of the electronic components, a semiconductor packaging technique for integrating a plurality of individual circuit elements into one package, as well as a technique of reducing a size of an individual mounted component have been required. To be specific, a semiconductor package involved in a high frequency signal is required to have various electromagnetic interference shielding structures for preventing electromagnetic wave interference and excellently embodying electromagnetic wave immunity characteristics as well as realizing miniaturization.

In the electromagnetic interference shielding structure according to the related art, which is applied to a semiconductor package, various types of circuit elements are covered with a pressed metal shield can.

In a manufacturing process of a printed circuit board of a mobile phone, after circuit elements and a shield can are soldered to a printed circuit board through a reflow process, an additional process for adding various functions to a mobile phone is performed. Such the additional process is necessarily performed after the reflow process since there could be a problem during the process due to a high temperature.

However, for functional reasons, an additional process may have to be performed before a shield can is soldered to a printed circuit board. In this case, there is a difficulty in performing the additional process due to the limitations of a process order and a process performed at a high temperature.

For example, as an additional process, thermal interface material (TIM) for heat control may be applied onto a circuit element to prevent function degradation and deterioration of a circuit element due to a circuit element which dissipates heat during a circuit operation. A thermally conductive material may achieve efficient heat transfer by eliminating an air gap between two members adjacent to each other (a circuit element, and a shield can) and increasing a contact area.

A process of applying a thermally conductive material onto a circuit element needs to be performed before the circuit element is covered with a shield can. However, when a thermally conductive material is applied onto a circuit element, a shield can is mounted on a print circuit board, and then the print circuit board is put into an oven to go through a reflow process, the thermally conductive material may melt and flows down from an upper surface of the circuit element due to high temperature. Therefore, heat is not properly transferred.

Therefore, it is desirable that a process of applying a thermally conductive material onto a circuit element is performed after a reflow process, but the reflow process is performed while the circuit element is covered by a shield can. Thus, it is impossible to apply a thermally conductive material onto a circuit element after the reflow process. Therefore, according to the prior art, it is difficult to control the heat radiated from a circuit element.

In addition, due to a defective circuit element or a functional problem, a re-work may be performed in which the soldered circuit element is removed from the printed circuit board and replaced with a normal circuit element to assemble the printed circuit board.

In this case, hot air is blown to the printed circuit board and soldering is melted in order to remove a shield can soldered to the printed circuit board from the printed circuit board. The soldering of the circuit elements mounted on the printed circuit board (particularly, small-sized circuit elements) may be melted by hot air. Therefore, the circuit element is removed from the printed circuit board or its position is changed.

The above information is presented as background information only to assist with an understanding of the disclosure. No determination has been made, and no assertion is made, as to whether any of the above might be applicable as prior art with regard to the disclosure.

SUMMARY

Aspect of the disclosure are to address at least the above-mentioned problems and/or disadvantages and to providing an apparatus and method for an electromagnetic interference shielding structure in which a shield can and is not soldered, but is grounded to a printed circuit board with a shielding material and fixed simultaneously.

Another aspect of the disclosure is to provide an apparatus and method to an electromagnetic interference shielding structure for forming a reinforcing structure by applying an additional shielding material or insulting material to increase a fixing force of a shield can on a printed circuit board.

Additional aspects will be set forth in part in the description which follows and, in part, will be apparent from the description, or may be learned by practice of the presented embodiments.

In accordance with an aspect of the disclosure, an electromagnetic interference shielding structure is provided. The apparatus includes a shield pad surrounding at least one circuit element mounted on a printed circuit board, the shield pad being configured to be grounded to a ground pad formed on a printed circuit board, and a shield can include an upper plate, and a sidewall extending from the upper plate and partly embedded in the shield pad.

The electromagnetic interference shielding structure may further include a heat transfer member formed on an upper surface of the at least one circuit element and contacting the upper plate of the shield can.

The electromagnetic interference shielding structure may further include an under-fill formed between the at least one circuit element and the printed circuit board.

A conductive material forming the shield pad may be addition cure type silicon based, and wherein an insulating material forming the under-fill is silicon based. A conductive material forming the shield pad may be one of epoxy-based, urethane-based, and acrylic-based, and wherein an insulating material forming the under-fill is epoxy-based. A conductive material forming the shield pad may be one of epoxy-based, urethane-based, and acrylic-based, and wherein an insulating material forming the under-fill is silicon-based.

The electromagnetic interference shielding structure may further include an insulation dam formed between the shield pad and the under-fill. A conductive material forming the shield pad may be addition cure type silicone based, wherein an insulating material forming the under-fill is epoxy based, and wherein an insulating material forming the insulation dam is addition cure type silicon based. A conductive material forming the shield pad may be one of epoxy-based, urethane-based, and acrylic-based, and wherein an insulating material forming the under-fill is epoxy-based. A conductive material forming the shield pad may be one of epoxy-based, urethane-based, and acrylic-based, and wherein an insulating material forming the under-fill is silicon-based.

A part of the insulation dam may be overlapped with the shield pad.

The insulation dam may be formed along the shield pad in parallel with the shield pad.

The electromagnetic interference shielding structure may further include a fixing force reinforcing member covering the sidewall of the shield can, the shield pad, and a partial upper surface of the printed circuit board.

The fixing force reinforcing member may be formed of a shielding material or an insulating material.

The fixing force reinforcing member may be formed on at least one corner of the shield can, the fixing force reinforcing member may be formed along the sidewall of the shield can with a predetermined distance, or the fixing force reinforcing member may be consecutively formed along the sidewall of the shield can.

A lower end of the sidewall of the shield can may be linearly formed.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
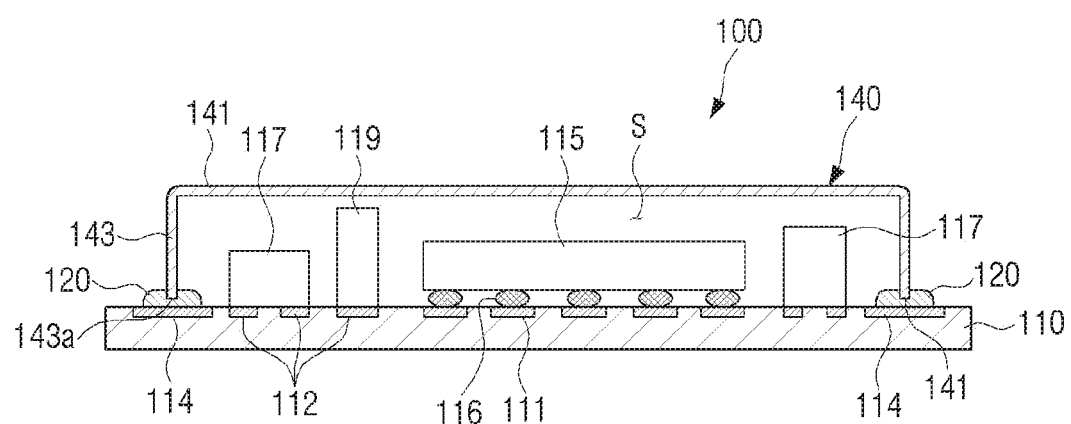
FIG. 1 is a cross-sectional view illustrating an electromagnetic interference shielding structure according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It will be understood that when an element is referred to as being "on" or connected to" another element, it can be directly connected to the other element or intervening elements may also be present. In contrast, when an element is referred to as being "directly on" or "directly connected to" another element, no intervening elements are present. Meanwhile, other expressions describing relationships between components such as "~ between" and "directly adjacent to ~" may be construed similarly.

The terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, without departing from the scope of the disclosure, the first component may be referred to as a second component, and similarly, the second component may also be referred to as a first component.

Singular forms in the disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms (including technical and scientific terms) used herein have the same meaning as commonly understood by one of ordinary skill in the art to which this disclosure belongs.

An electromagnetic interference shielding structure according to embodiments of the disclosure could be applied various electronic devices such as a display device, a wearable device, etc. It is described that the electromagnetic interference shielding structure according to embodiment of the disclosure shields a plurality of circuit elements, but is not limited thereto and the electromagnetic interference shielding structure is formed to shield a single circuit element.

Hereinafter, an electromagnetic interference shielding structure according to an embodiment of the disclosure will be described in detail with reference to drawings.

FIG. 1 is a cross-sectional view illustrating an electromagnetic interference shielding structure according to an embodiment of the disclosure.

Referring to FIG. 1, an electromagnetic interference shielding structure 100 may include a printed circuit board 110 and a plurality of circuit elements 115, 117 and 119 mounted on the printed circuit board 110. The plurality of circuit elements may be different types of circuit elements, and may be an integrated circuit (IC) chip, a passive element, or a different-shaped component. For example, the IC chip may be an application processor (AP), a memory, a radio frequency (RF) chip or the like, the passive element may be a resistor, a capacitor, a coil, or the like, and the different shaped component may be a connector, a card socket, an electromagnetic shielding component, or the like.

The ground pad 114 may be patterned in the printed circuit board 110. The ground pad 114 may be formed on the printed circuit board 110 with an upper surface of the ground pad 114 exposed without protruding toward an upper surface of the printed circuit board 110. In this case, the ground pad 114 may be integrally formed on a ground layer (not shown) formed in the printed circuit board 110.

The ground pad 114 may be formed on the printed circuit board 110 with the top surface of the ground pad 114 exposed without protruding from the top surface of the printed circuit board 110.

The ground pad 114 may be patterned to correspond to the outermost of the shielding structure. The ground pad 114 may be defined by a solid line or a dotted line. Ground terminals of the plurality of circuit elements 115, 117 and 119 may be grounded to the ground pad 114.

The circuit element 115 may include a plurality of connection terminals 116 electrically connected to a first connection pad 111 of the printed circuit board 110. The plurality of connection terminals 116 may be formed in a ball grid array (BGA) method. However, the formation of the plurality of connection terminals 116 is not limited to the BGA method, but embodied using various methods such as quad flat no lead (QFN), plastic leaded chip carrier (PLCC), quad flat package (QFP), small out line package (SOP), thin/shrink/thin shrink SOP (TSOP/SSOP/TSSOP), etc. depending on a lead form of the circuit element 115.

The circuit elements 117 and 199 may include at least one connection terminal (not shown) electrically connected to a second connection pad 112 of the printed circuit board 110. The circuit elements 117 and 19 may have a smaller or greater height than the circuit element 115 when mounted on the printed circuit board 110. Gaps between the circuit elements 115, 117 and 119 may be designed to be equal to or smaller than 0.8 mm.

Referring to FIG. 1, the electromagnetic interference shielding structure 100 according to an embodiment of the disclosure may include a shield pad 120 formed on the ground pad 114 and a shield can 140 covering the plurality of circuit elements 115, 117 and 119.

The shield pad 120 may be formed along the ground pad 114. Accordingly, when the pattern of the ground pad 114 is shaped in the form of a closed curve, the pattern of the shield pad 120 may also be shaped in the form of a closed curve. However, the pattern of the shield pad 120 may not match the pattern of the ground pad 114. In other words, the pattern of the shield pad 120 may be formed to partly correspond to the pattern of the ground pad 114.

The shield pad 120 may have a predetermined thickness. It is enough if the thickness of the shield pad 120 is such that a lower portion 143*a* of a sidewall 143 of the shield can 140 is not contacted to the ground pad 114 but embedded in the shield pad 120. It is also possible that the thickness of the shield pad 120 may be greater than that of the shield pad 120 shown in FIG. 1 so as to be formed in a dam shape. In this case, the lower end portion of the shield can 140 may be grounded to the ground pad 114 through the shield pad 120.

Figure 5:
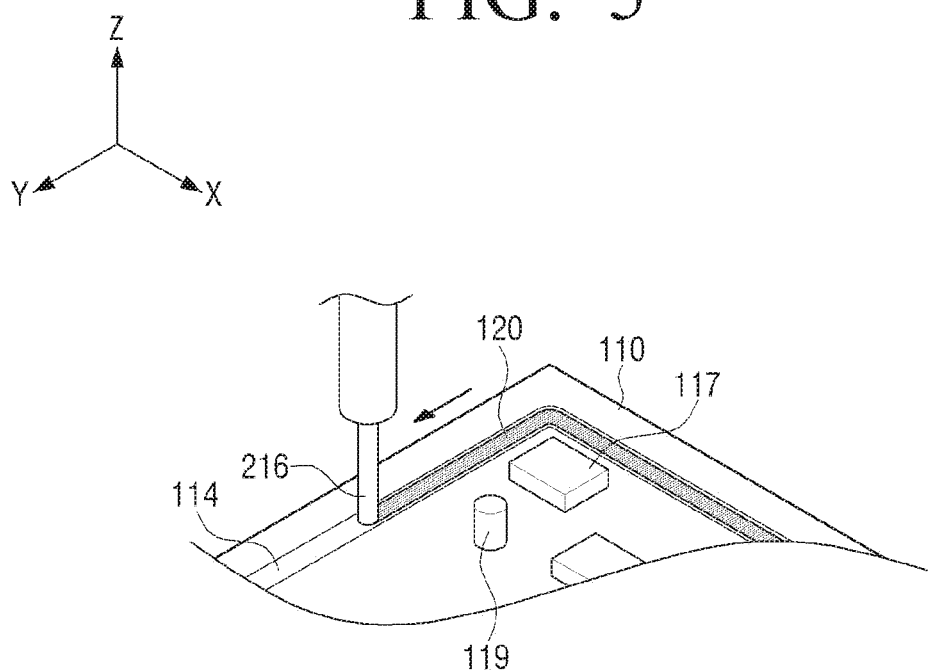
FIG. 5 is a view illustrating an example of forming a shield pad on a printed circuit board while a nozzle moves along a preset path according to an embodiment of the disclosure.

The shield pad 120 may be formed of an electroconductive material having a predetermined viscosity, which is discharged from a first nozzle 216 (see FIG. 5). Such the electroconductive material may include an electroconductive filler and a binder resin.

As an electroconductive filler, metal such as Ag, Cu, Ni, Al, or Sn may be used, conductive carbon such as carbon black, carbon nanotube (CNT), graphite or the like may be used, metal coated materials such as Ag/Cu, Ag/Glass fiber, Ni/Graphite, or the like may be used, or conductive polymer materials such as polypyrrole, polyaniline, or the like may be used. The electroconductive filler may be formed of any one of a flake type, a sphere type, a rod type, and a dendrite type, or the combination thereof.

As the binder resin, a silicone resin, an epoxy resin, a urethane resin, an alkyd resin, or the like may be used. The material constituting the shield pad 120 may further contain additives (a thickener, an antioxidant, a polymer surfactant, etc.) for improving other performance and a solvent (water, alcohol, etc.).

If the fluidity of a shielding material is too great, there occurs a problem that the shielding material may move to a position beyond the ground pad 114. Thus, it is desirable that the viscosity of the shielding material is between 1,000 cps and 100,000 cps.

The shield can 140 may be formed of conductive metal, and have an area corresponding to a shield area to cover all the shield areas. The shield can 140 may use conductive metal, for example, stainless steel, or the stainless steel where the surface is formed by special treatment to improve an adhesion force of the shield pad 120.

The structural stability may be ensured since the shield can 140 is formed in a plate shape having a predetermined thickness to have rigidity. The shield can 140 may include an upper plate 141 and a sidewall 143 downwardly bent along a rim of the upper plate 141. The upper plate 141 may be substantially flat, and cover the upper portion of the shield area. At least one air discharging hole (not shown) may be formed in the upper plate 141 so that thermally expanded air could be discharged from an insulating space portion S formed between the printed circuit board 110.

A hole may be formed in the shield can 140 for another purpose apart from air discharge. In other words, a hole having a predetermined width (not shown) may be formed in a part of the upper plate 141 of the shield can 140 corresponding to the position of a circuit element (e.g., oscillator) to prevent the case where unnecessary capacitance between the circuit element and the shied can 140 occurs and the frequency characteristic is changed. In addition, when a height of the circuit element used in the shield area is greater than a height of the upper plate 141 of the shield can 140, a hole (not shown) may be formed so that the circuit element is not interfered by the upper plate 141 of the shield can 140.

The lower portion 143*a* of the sidewall 143 of the shield can 140 may be mounted on the shield pad 120. The lower portion 143*a* of the sidewall 143 may be inserted in the shield pad 120 when mounted on the upper portion of the shield pad 120 before the shield pad 120 is cured. Therefore, when the shield pad 120 is cured with the lower portion 143*a* of the sidewall 143 being embedded in the shield pad 120, the shield can 140 may be stably fixed to the shield pad 120.

Meanwhile, when a process of applying thermally conductive material (not shown) to a heating element is applied to a process of manufacturing an electromagnetic interference shielding structure, the thermally conductive material may be applied onto the heating element and then the shield can 140 may be fixed to the shield pad 120. It is desirable that the shield pad 120 is formed of an electronic conductive material that could be cured at room temperature or at a heating temperature that the thermally conductive material does not dissolve. The thermally conductive material applied onto the upper portion of the heating element may be in close contact with a lower surface of the upper plate 141 of the shield can and heat generated by the heating element may be dispersed through the shield can 140 to cool the heating element. When a heat pipe (not shown) is mounted on the upper surface of the upper plate 141 of the shield can 140, the heat transferred to the shield can 140 may be dispersed to a frame of an electronic apparatus (not shown) through a heat pipe. Thus, a cooling effect may be improved.

In addition, in the electromagnetic interference shielding structure 100 according to an embodiment, the shield can 140 may be fixed to the shield pad 120 having a predetermined elasticity. Thus, the shield pad 120 may be easily removed from the printed circuit board 110 by using a paddle-shaped tool without applying hot air during a rework process.

Hereinafter, a process of manufacturing the electromagnetic interference shielding structure 100 according to an embodiment will be sequentially described in detail referring to FIG. 2A. FIG. 2 is a cross-sectional view illustrating a manufacturing process of an electromagnetic interference shielding structure according to an embodiment of the disclosure, and FIG. 3 is a view showing an example in which a shield pad is formed on a ground pattern using a shield material discharged from a nozzle.

Figure 2A:
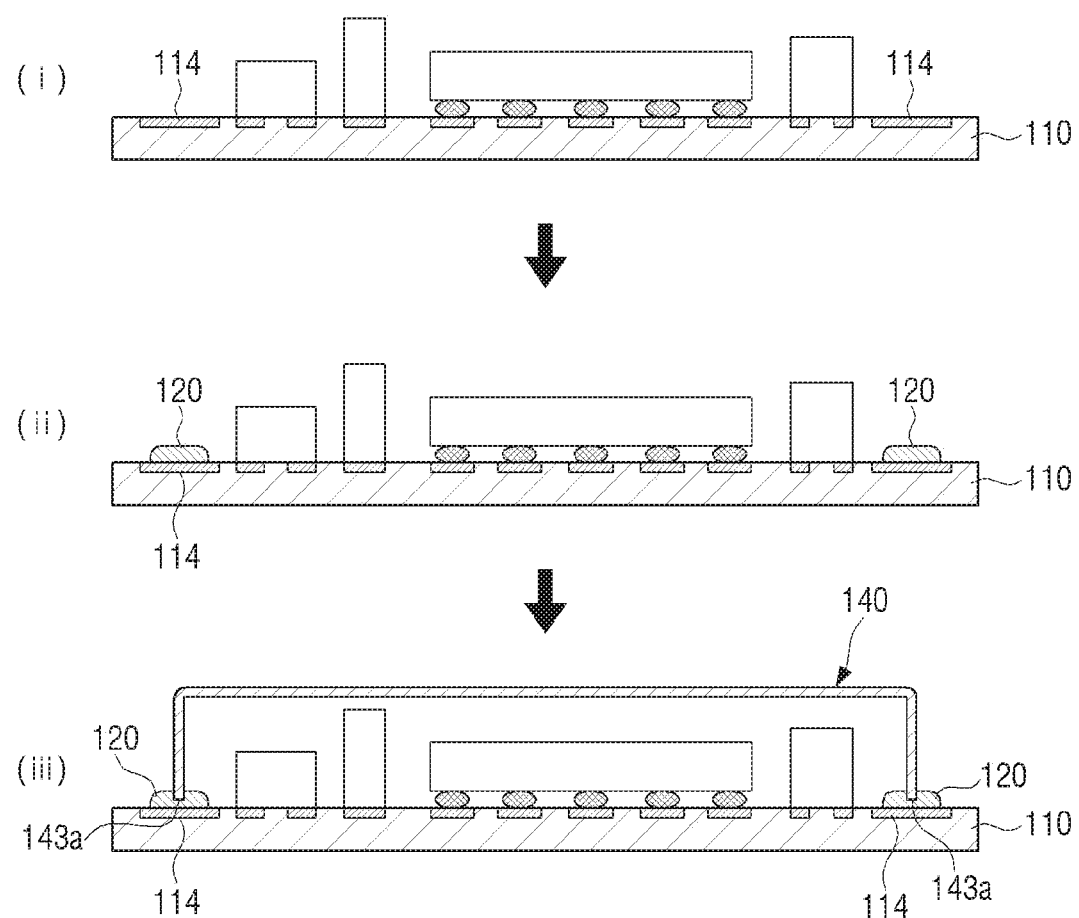
FIG. 2A is a cross-sectional view illustrating a manufacturing process of an electromagnetic interference shielding structure according to an embodiment of the disclosure.
Figure 3:
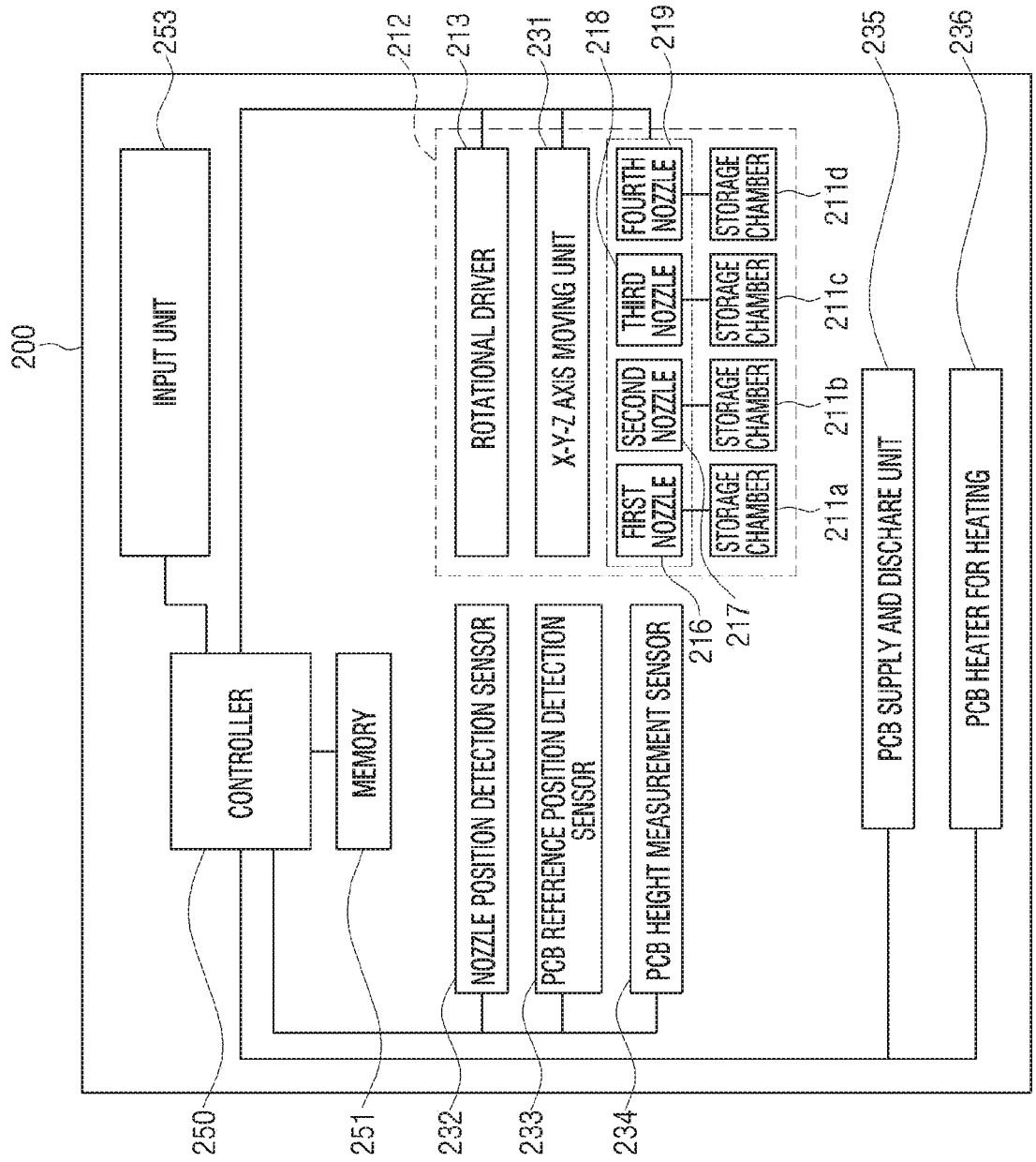
FIG. 3 is a block diagram to explain a material discharging device for forming a shield pad shown in FIG. 2A according to an embodiment of the disclosure.

Referring to (i) of FIG. 2A, the plurality of circuit elements 115, 117 and 119 are mounted on the printed circuit board 110. The ground pad 114 corresponding to the outside of the shield area may be patterned in the printed circuit board 110 in advance.

Figure 4:
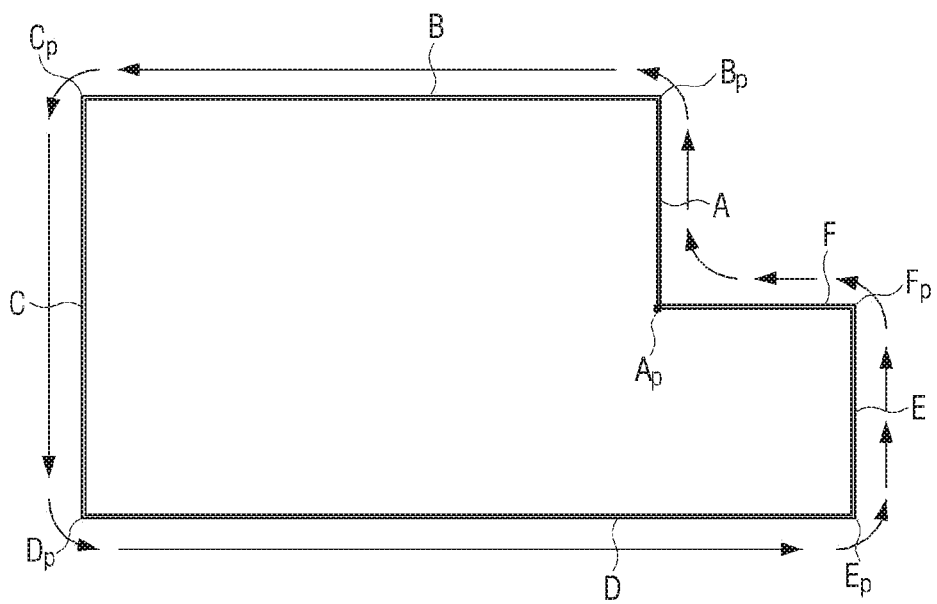
FIG. 4 is a view illustrating an example of a path through which a nozzle of a material discharging device moves according to an embodiment of the disclosure.

Referring to FIGS. (ii) of FIG. 2A and FIG. 4, a first nozzle 216 may discharge a shield material while moving along a preset path. The discharged shield material may be the shield pad 120 having a predetermined thickness, which is formed on the ground pad 114 along the ground pad 114.

After the shield pad 120 is formed, as shown in (iii) of FIG. 2A, the shield can 140 may be attached to the printed circuit board 110 by using a robot arm. After the lower portion 143a of the sidewall 143 is mounted on the shield pad 120, the shield can 140 may be inserted in the shield pad 120 by a predetermined pressure applied toward the printed circuit board 110. The lower portion 143a of the sidewall 143 may be embedded in the shield pad 120 while being spaced apart from the ground pad 114 by a predetermined distance. However, the disclosure is not limited thereto. The shield can 140 may be inserted in the shield pad 120 so that the lower portion 143a of the sidewall 143 could be in contact with the ground pad 114 (see FIG. 18).

According to the electromagnetic interference shielding structure 100, since the shield can 140 is fixed to the shield pad 120 having a predetermined elasticity, the shield pad 120 may be easily removed from the printed circuit board 110 by using a pincette or a paddle without applying hot air during a rework process. The rework process may be performed mainly when an element shielded by the shielding structure needs to be changed, or the shield can 140 is not arranged at a correct position.

The rework process may be sequentially described with reference to FIG. 2B. The rework process may be in approximately the reverse order of a process of forming the shielding structure described above.

Figure 2B:
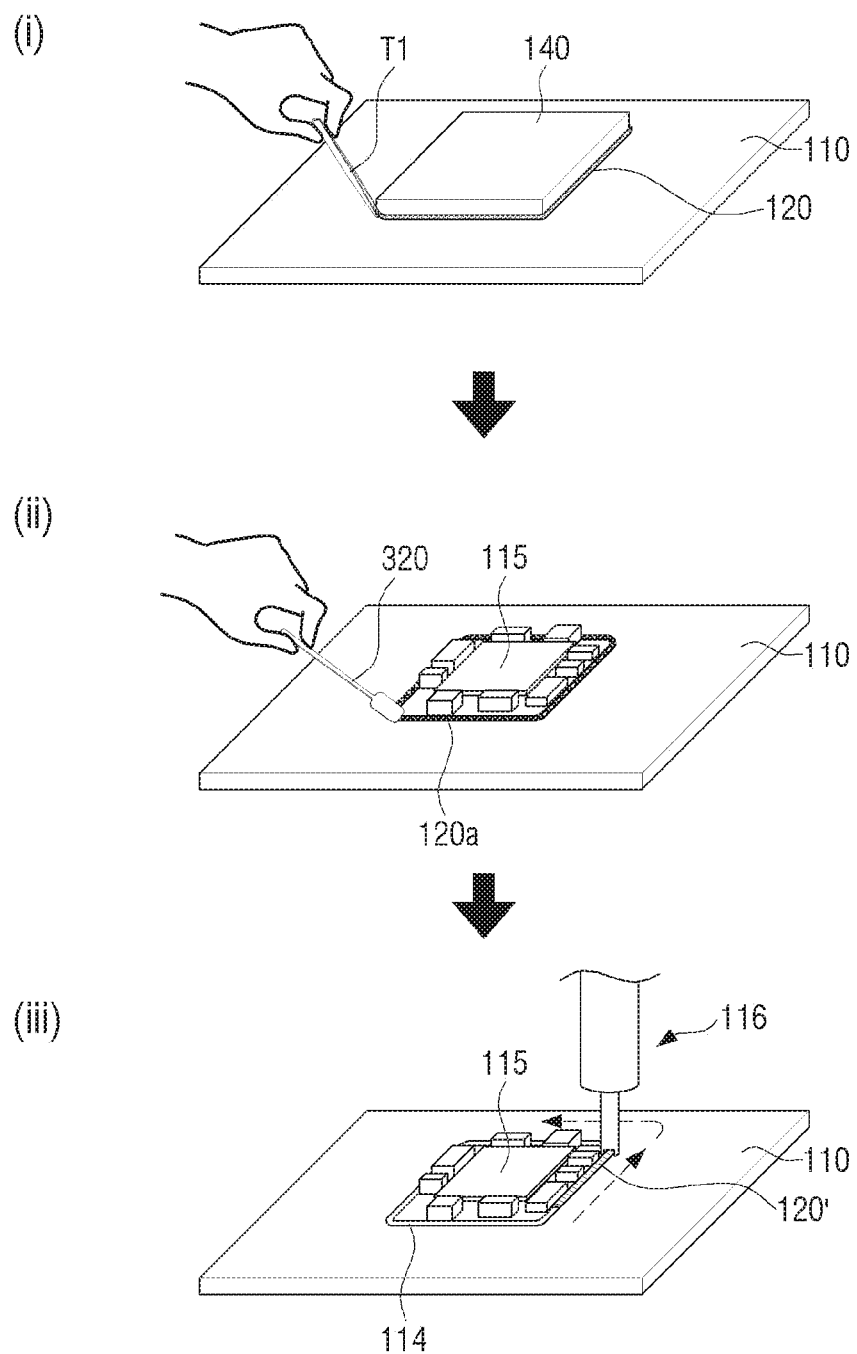
FIG. 2B is a cross-sectional view illustrating a rework process of an electromagnetic interference shielding structure according to an embodiment of the disclosure.

Referring to (i) of FIG. 2B, the shield pad 120 may be removed from the printed circuit board 110 by using a pincette T1 so that the shield can 140 could be removed from the shield pad 120.

Referring to (ii) of FIG. 2B, after the shield can 140 is completely removed from the shield pad 120, and a remaining portion 120a of the shield pad that remains on the upper surface of the printed circuit board 110 may be scraped by a spatula 310 to be completely removed from the printed circuit board 110.

Referring to (iii) of FIG. 2B, a shield pad 120' may be formed along the ground pad 114 by using a first nozzle 216 when the shielding structure is removed. After the shield pad 120' is formed, as shown in the process of (iii) of FIG. 2A, a new shielding structure may be formed by mounting a shield can on a shield pad.

When the shield pad 120 is formed through 3D printing, a shielding structure may be easily removed, and shielded elements may be reused.

Accordingly, the disclosure does not require a process that has been performed in the related art (a process of applying hot air to the shielding structure to remove the shield can 140 from the printed circuit board 110). Therefore, it is possible to fundamentally solve the problem that soldering of small elements mounted on the printed circuit board 110 is melted by hot air, and the small elements are removed from the printed circuit board 110 or the preset positions thereof are changed.

Hereinafter, referring to FIGS. 3 to 6, a material discharging device for forming a shield pad of the electromagnetic interference shielding structure 100 according to an embodiment of the disclosure and a forming method thereof will be described.

Figure 6:
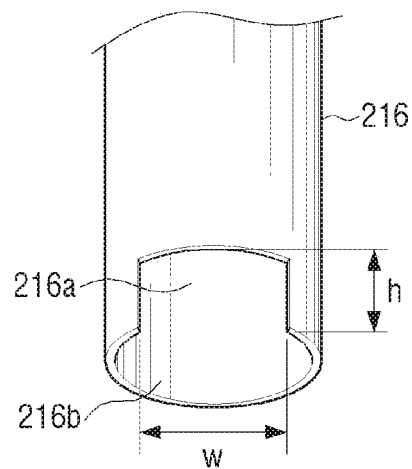
FIG. 6 is an enlarged perspective view illustrating a cross-section of the nozzle shown in FIG. 5 according to an embodiment of the disclosure.

FIG. 3 is a block diagram to explain a material discharging device for forming a shield pad shown in FIG. 2A, FIG. 4 is a view illustrating an example of a path through which a nozzle of a material discharging device moves, FIG. 5 is a view illustrating an example of forming a shield pad on a printed circuit board while a nozzle moves along a preset path, and FIG. 6 is an enlarged perspective view illustrating a cross-section of the nozzle shown in FIG. 5.

Referring to FIG. 3, a material discharging device 200 may include a dispenser 212 for discharging a predetermined amount of insulating material. The dispenser 212 may include a storage chamber 211a for storing an insulating material, and first to fourth nozzles 216, 217, 218 and 219 for discharging a material supplied from the storage chamber 211a.

The dispenser 212 may include the first, second, third and fourth nozzles 216, 217, 218 and 219, an X-Y-Z axis moving unit 231 for moving nozzles in an X axis direction, a Y axis direction, and a Z axis direction, and a rotational driver 213 for rotating the first to fourth nozzles 216, 217, 218 and 219 in a clockwise direction or counterclockwise direction or stopping the rotation of the nozzles.

The first nozzle 216 may discharge a shield material for forming the shield pad 120 as described above. The first nozzle 216 may be connected to a first storage chamber 211a where the shield material is stored, and supplied with the shield material.

The second nozzle 217 may discharge an insulating material for forming an insulation dam 155 (see FIG. 10A) disposed inside the shield pad 120. The second nozzle 217 may be connected to the second storage chamber 211b where the insulating material is stored, and supplied with the insulating material.

The third nozzle 218 may discharge an insulating material (e.g., silicon or epoxy-based resin) for forming an under-fill 153 (see FIG. 8) between a circuit element having a large area and a printed circuit board. The third nozzle 218 may be connected to a third storage chamber 211c where the insulating material is stored and supplied with the insulating material.

The fourth nozzle 219 may discharge a shield material or an insulating material for forming a fixing force reinforcing member 170 (see FIG. 14) disposed along a lower outer side of the shield can 140. The fourth nozzle 219 may be supplied with a shield material or an insulating material from the fourth storage chamber 211d where a shield material or an insulating material is stored.

It is described the nozzle includes fourth nozzles, but the disclosure is not limited thereto. The nozzle may include at least one nozzle according to the electromagnetic interference shielding structure.

The X-Y-Z axis moving unit 231 may include a plurality of operation motors (not shown) for moving the first, second and third nozzles 216, 218 and 219 in the X axis direction, the Y axis direction, and the Z axis direction, respectively. Such the operation motors may be connected to a nozzle mounting unit (not shown) on which the first nozzle 216 is mounted to transmit a driving force to the first to third nozzles 216, 217 and 218. The rotational driver 213 may include a motor (not shown) for providing a rotational force, and an encoder (not shown) for controlling rotational angles of the first to third nozzles 216, 217 and 218 by detecting the number of rotations of the motor. The X-Y-Z axis moving unit 231 and the rotational driver 213 may be electrically connected to a controller 250 (e.g., at least one processor) and controlled by the controller 250.

When discharge ports of the first to third nozzles 216, 217 and 218 of the material discharging device 200 are cleaned or newly replaced, an end portion of the nozzle discharging a material may not be exactly disposed at a preset position. Therefore, a nozzle position detection sensor 232 may be provided to set the first to third nozzles 216, 217 and 218 to the setting positions.

The nozzle position detection sensor 232 may be embodied with a vision camera, and disposed under the first to third nozzles 216, 217 and 218 with a predetermined gap therebetween. The calibration of the nozzle may read the position of the end portions of the first to third nozzles through an image captured by the nozzle position detection sensor 232, compare the positions with a pre-stored nozzle origin value in a memory 251 in advance, and move the first to third nozzles 216, 217 and 218 by X and Y values, which are difference, so that the end portion of each nozzle may be aligned with a nozzle origin. The first, second and third nozzles 216, 217 and 218 may move upon the moving of the nozzle mounting unit (not shown) as the X-Y-Z axis moving unit 231 is driven.

When a printed circuit board is loaded to a position for forming a shield pad, the material discharging device 200 may set a starting point Ap of each nozzle for discharging a material by detecting the position of the printed circuit board on an X-Y plane on which the printed circuit board is placed. To detect the position of the printed circuit board after loading, the material discharging device 200 may include a printed circuit board (PCB) reference position detection sensor 232 and a PCB height measurement sensor 234.

The PCB reference position detection sensor 233 may be a sensor for determining a position of PCB loading and embodied with a vision camera. The PCB reference position detection sensor 233 may detect whether a printed circuit board loaded to a workspace for forming a shielding structure is disposed at a preset position or how far the printed circuit board is disposed from the preset position. For example, when a printed circuit board is loaded to a work position, the controller 250 may move the PCB reference position detection sensor 233 to a coordinate of a preset first reference mark and capture a first reference mark of the printed circuit board, compare the shape of the captured first reference mark with the shape of the preset first reference mark, and determine whether the PCB reference position detection sensor 233 is disposed at its position.

When it is determined that the PCB reference position detection sensor 233 is disposed at its position, the controller 250 may calculate the position difference between a coordinate of the first reference mark and a coordinate of the preset first reference mark. The controller 250 may calculate the position difference between the coordinate of the second reference mark and the coordinate of the preset reference mark in the same manner as the method of calculating the coordinate of the first reference mark.

The material discharging device 200 may include a PCB supply and discharge unit 235 for loading the printed circuit board to a work position in order to form the shield pad 120 on the printed circuit board, and after completion of the shield pad formation, unloading the printed circuit board.

The material discharging device 200 may further include a PCB heating heater 236 for raising the printed circuit board to a predetermined temperature to shortening a drying time of the shield pad 120.

The material discharging device 200 may include an input unit 253 where a user directly inputs a movement path of each of the nozzles 216, 217 and 218. The input unit 253 may be embodied with a touch screen available for touch input or a typical key pad. The user may directly input the movement path of each of the nozzles 216, 217 and 218 through the input unit 253. The movement path of each nozzle that is input once through the input unit 253 may be stored in the memory 251. Thereafter, the user may modify nozzle movement path data stored in the memory 251 through the input unit 253.

Hereinafter, a process of inputting a nozzle movement path of the first nozzle 216 through the input unit 253 will be described. The process of inputting the nozzle movement paths of the second, third and fourth nozzles 217, 218 and 219 may be the same as the process of inputting the nozzle movement path of the first nozzle 216.

At least two reference marks displayed on the printed circuit board loaded to the work position may be captured through the PCB reference position detection sensor 233 (e.g., a vision camera, hereinafter, referred to as 'vision camera'), a distance between the two reference marks may be measured, and respective images of the reference marks and a distance value between the two reference marks may be stored in the memory 251. When the printed circuit board has a rectangular shape, the two reference marks may be displayed at the left upper end and the right lower end of the printed circuit board. In this case, a difference between the two reference marks may represent a straight line length in a diagonal direction of the printed circuit board.

To be specific, when the printed circuit board is loaded to the work position, a user may move a vision camera to the position where the first reference mark is disposed at the left upper end (e.g., based on a center of the first reference mark or one portion of the first reference mark) by using forward, backward, left, and right movement buttons provided on the input unit 253, and then presses a storage button provided on the input unit 253. The controller 250 may calculate a distance between a preset original point (0,0,0) and the first reference mark, obtain a coordinate (X1, Y1 and Z1) of the first reference mark, and store the coordinate in the memory 251. The capturing position of the vision camera which moves along with the first nozzle 216 may be offset from a center of the nozzle 216 by a predetermined distance. Therefore, the coordinate (X1, Y1 and Z1) of the first reference mark may be calculated considering an offset value by the controller 250. When the user presses a capturing button, the image of the first reference mark may be stored in the memory 251.

The user may move the vision camera to the position where the second reference mark is disposed at the lower right end (e.g., based on a center of the second reference mark or one portion of the second reference mark) by using the forward, backward, left and right movement buttons provided on the input unit 253, and then press the storage button provided on the input unit 253. The controller 250 may calculate a difference between the preset original point (0,0,0) and the second reference mark, obtain a coordinate (X2, Y2 and Z2) of the second reference mark, and store the coordinate in the memory 251. When the user presses the capturing button, the memory of the second reference mark may be stored in the memory 251. The coordinate (X2, Y2 and Z2) of the second reference mark may be calculated by considering the offset value by the controller 250 in the same manner as the process of calculating the coordinate (X1, Y1 and Z1) of the first reference mark as described above.

The controller 250 may calculate a difference between the two positions and stored the space in the memory 251 by using the positions of the first and second reference marks as detected above.

The user may move the vision camera along a path of the shield pad 120 formed on the printed circuit board 110 by using the forward, backward, left and right movement buttons (not shown) of the input unit 253, confirm a real time image that is captured by the vision camera with a naked eye, and input a plurality of coordinates positioned on the movement path of the first nozzle 216. The coordinate may be input by pressing a coordinate input button provided in the input unit 253 when the vision camera is disposed at any point on the movement path of the first nozzle 216. The input coordinate may be stored in the memory 251.

As shown in FIG. 6, the plurality of coordinates may be a coordinate Ap of a point at which the first nozzle 216 starts discharging a material, and a coordinate of a point at which the first nozzle 216 stops discharging (when a shield pad is a closed curve, a point for stopping discharging may be arranged adjacent to the starting point Ap), respective coordinates with respect to positions Bp, Cp, Dp, Ep and Fp at which the first nozzle 216 changes its direction on the move.

In order to program the movement path of the first nozzle 216, the input unit 253 may further include various command buttons such as a movement button for moving the first nozzle 216 to a designated coordinate, a line button for causing the first nozzle 216 to move discharging a material, and rotational button for changing a movement direction of the first nozzle 216. The user may match the command buttons with the coordinates and the rotational angles and generate the movement path of the first nozzle 216.

The movement path of the first nozzle 216 is programmed by a user as described above, the controller 250 may move the first nozzle 216 along a nozzle movement path, and an insulating material may be discharged, so that the shield pad 120 may be automatically generated on the printed circuit board 110.

The data with respect to the movement path of the first nozzle 216 input through the input unit 253 may be stored in the memory 251. The controller 250 may operate the X-Y-Z axis moving unit 231 and the rotational driver 213 along the movement path data of the nozzle stored in the memory 251 and move the first nozzle 216 along the pre-input path. The nozzle path data may include a distance that the first nozzle 216 moves linearly along the upper surface of the printed circuit board 110 and a rotational direction and a rotational angle of the first nozzle 216.

It is described that a user directly inputs the movement path of the first nozzle 216 through the input unit 253, but the disclosure is not limited thereto. The nozzle movement path may be pre-stored in the memory 251, and in this case, a plurality of movement paths with respect to the first nozzle 216 may be pre-stored to correspond to the pattern of the shield pad 120 which is variously formed depending on the product. In addition, calibration information, reference position information of a nozzle, PCB reference position information, PCB reference height information, or the like may be pre-stored in the memory 251.

Referring to FIG. 5, a side surface discharge port 216a may be formed on a side surface of a lower end of the first nozzle 216, and a lower surface discharge port 216b discharging a shield material may be formed on a lower surface of the lower end. Therefore, when the first nozzle 216 moves along an Y axis direction, the shield material discharged from the first nozzle 216 may be simultaneously discharged from the side surface discharge port 216a and the lower surface discharge port 216b, and formed on the printed circuit board.

The side surface discharge port 216a may be formed in a square shape having a width (w) and a height (h). The width and the thickness of the shield pad 120 may be determined according to the width (w) and the height (h) of the side surface discharge port 216a.

The lower surface discharge port 216b may be set to have a predetermined gap from the upper surface of the printed circuit board not to be interfered by the upper surface of the printed circuit board 110 when moving along the preset nozzle movement path.

The first nozzle 216 may form the shield pad 120 along the nozzle movement path stored in the memory 251 as described above. The detailed description thereof will be made with reference to FIG. 6.

Referring to FIG. 6, the first nozzle 216 may be set to a coordinate corresponding to the starting point Ap. The controller 250 may operate the rotational driver 213 so that the side surface discharge port 216a is directed in the direction opposite to the direction of the first nozzle 216, and rotate the first nozzle 216 at a predetermined angle.

The first nozzle 216 set to the coordinate corresponding to the starting point Ap may linearly move in a +Y axis direction by section A by the X-Y-Z axis moving unit 231. The first nozzle 216 may move along a section where a path is bent (a section including a point Bp connecting section A to section B). The first nozzle 216 may move along the nozzle movement path by the X-Y-Z axis moving unit 231, and may be rotated by the rotational driver 213 so that the side surface discharge port 216a continuously faces the sidewall 143 of the shield can 140.

The first nozzle 216 may linearly move in the −X axis direction by section B by the X-Y-Z axis moving unit 231 after passing through a section where a path is bent. In the similar manner, the first nozzle 216 may repeat the linear movement and rotation of B, C, D, E and F sections by the rotational driver 213 and the X-Y-Z axis moving unit 231 and return to the starting point Ap. Therefore, the path movement of the first nozzle 216 may be completed.

Hereinafter, the examples of the electromagnetic interference shielding structure having various structures provided through an additional process, which is formed before a shield can is mounted during a process of forming the electromagnetic interference shielding structure will be described with reference to FIGS. 7 to 13. According to FIGS. 7 to 10B and 13, illustration of the circuit elements 117 and 119 other than the circuit element 115 in the electromagnetic interference shielding structure shown in FIG. 1 will be omitted for convenience of explanation.

Figure 7:
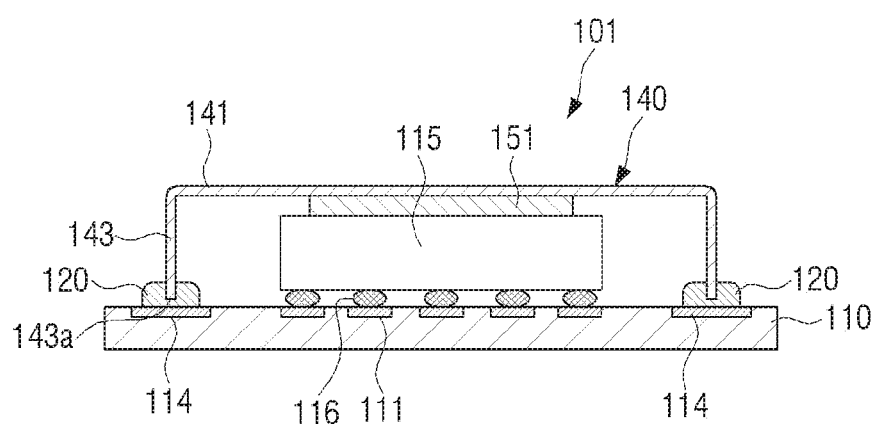
FIG. 7 is a cross-sectional view illustrating an embodiment in which a heat transfer member is additionally formed in the electromagnetic interference shielding structure shown in FIG. 1 according to an embodiment of the disclosure.

FIG. 7 is a cross-sectional view illustrating an embodiment in which a heat transfer member is additionally formed in the electromagnetic interference shielding structure shown in FIG. 1.

Referring to FIG. 7, the electromagnetic interference shielding structure 101 may include a heat transfer member 151 on the upper surface of the circuit element 115 in order to conduct heat to the shield can 140 radiated from the circuit element 115. It is sufficient if the heat transfer member 151 is thick enough so that the upper surface of the heat transfer member 151 is in contact with the lower surface of the upper plate 141 of the shield can 140 when the shield can 140 is mounted on the shield pad 120. The circuit element 115 may be an integrated circuit (IC) chip that generates heat when it is driven, such as an Application Processor (AP) chip, a memory chip, and a radio frequency (RF) chip.

The electromagnetic interference shielding structure 101 may effectively transmit the heat radiated from the circuit element 115 during a circuit operation to the shield can 140 through the heat transfer member 151 and prevent the circuit element 115 from being deteriorated.

The manufacturing process of the electromagnetic interference shielding structure 101 may be the same as the process of manufacturing the electromagnetic interference shielding structure 100 shown in FIG. 2A, except for the process of applying thermal interface material (TIM) on the upper surface of the circuit element 115 for forming the heat transfer member 151.

The heat transfer material having a predetermined thickness and a predetermined width may be applied to the upper surface of the circuit element 115. A dispenser 212 may further include an additional nozzle (not shown) discharging a heat transfer material for forming the heat transfer member 151.

The heat transfer material may be applied to the upper surface of the circuit element 115 before or after the shield pad 120 is formed. In other words, the heat transfer material could be applied at any time if it is before the shield can 140 is mounted on the shield pad 120.

The heat transfer material applied to the electromagnetic interference shielding structure 101 may be formed of an adhesive tape or a graphite sheet in addition to in a grease form.

Figure 8:
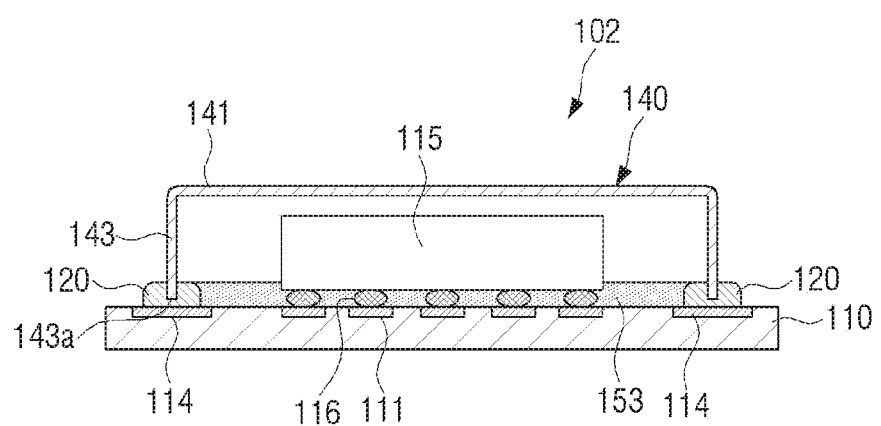
FIG. 8 is a cross-sectional view illustrating an embodiment in which an under-fill is additionally formed in the electromagnetic interference shielding structure shown in FIG. 1 according to an embodiment of the disclosure.

FIG. 8 is a cross-sectional view illustrating an embodiment in which an under-fill is additionally formed in the electromagnetic interference shielding structure shown in FIG. 1.

An electromagnetic interference shielding structure 102 shown in FIG. 8 is the case where the under-fill 153 used for one of typical circuit element mounting methods to increase an adhesion force between the circuit element 115 having a large area and the printed circuit board 110 is applied. In this case, an insulating material may be used as a resin for forming an under-fill, which is silicon based or epoxy based.

Since the resin for forming an under-fill 153 should be spreadable, the viscosity of the resin may be low and the fluidity of the resin may be high. Therefore, after the formation of the shield pad 120, the resin for forming the under-fill 153 may be discharged passing through a third nozzle 218 into the closed curve formed by the shield pad 120. Accordingly, the insulating material may be flown between the circuit element 115 and the printed circuit board 110 due to high fluidity, and may form the under-fill 153.

Meanwhile, in order to prevent the under-fill 153 from being mixed into the shield pad 120, the conductive material forming the shield pad 120 may be made into an addition cure type silicon-based, and the insulating material constituting the insulating layer may be silicon-based.

Figure 9:
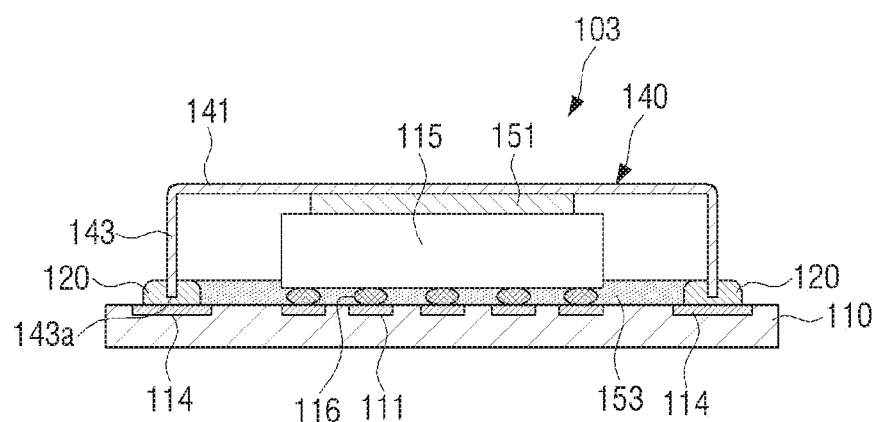
FIG. 9 is a cross-sectional view illustrating an embodiment in which a heat transfer member and an under-fall are additionally formed in the electromagnetic interference shielding structure shown in FIG. 1 according to an embodiment of the disclosure.

FIG. 9 is a cross-sectional view illustrating an embodiment in which a heat transfer member and an under-fall are additionally formed in the electromagnetic interference shielding structure shown in FIG. 1.

Referring to FIG. 9, an electromagnetic interference shielding structure 103 shown in FIG. 9 further includes a heat transfer member 151 in addition to the electromagnetic interference shielding structure 102 shown in FIG. 8.

The heat transfer material forming the heat transfer member 151 may be applied to the upper surface of the circuit element 115 before or after the shield pad 120 is formed or before or after the under-fill 153 is formed. In other words, the heat transfer material could be applied at any time if it is before the shield 140 is mounted on the shield pad 120.

Figure 10A:
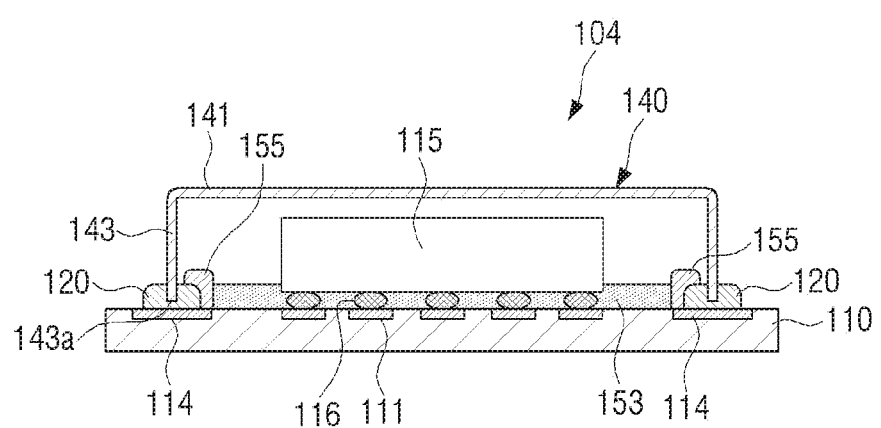
FIGS. 10A and 10B are cross-sectional views illustrating an embodiment in which an under-fill and an insulation dam blocking the under-fill from being incorporated into a shield pad are additionally formed in the electromagnetic interference shielding structure shown in FIG. 1 according to an embodiment of the disclosure.
Figure 10B:
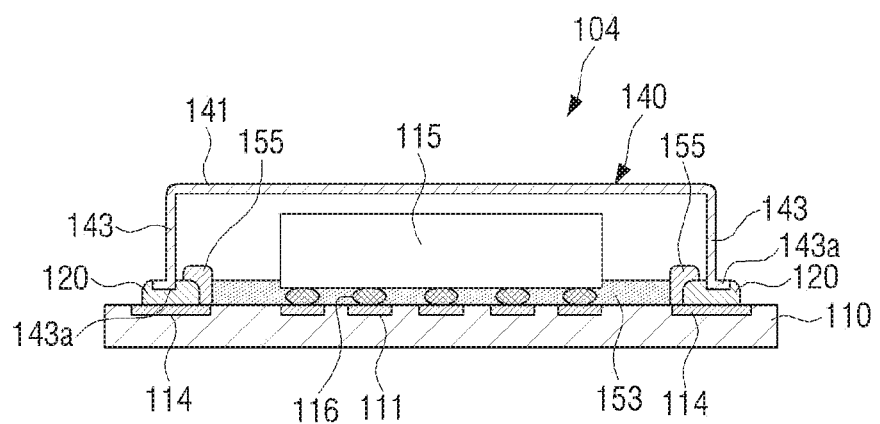

FIGS. 10A and 10B are cross-sectional views illustrating an embodiment in which an under-fill and an insulation dam blocking the under-fill from being mixed into a shield pad are additionally formed in the electromagnetic interference shielding structure shown in FIG. 1.

According to an electromagnetic interference shielding structure 104 shown in FIG. 10A, an insulation dam 155 may be formed so as to be overlapped with a part of the shield pad 120 along the shield pad 120. The under-fill 153 may be formed after the insulation dam 155 is formed. The insulation dam 155 may be formed of an insulating material discharged from a second nozzle 217.

The insulation dam 155 may prevent an insulating material having a high fluidity, which constitutes the under-fill 153, from being mixed into the shield pad 120. The insulation dam 155 may vary depending on the type of material of the shield pad 120 and the under-fill 153. For example, when a conductive material forming the shield pad 120 is addition curing type silicone based and a material forming the under-fill 153 is epoxy based, it is desirable that the insulating material constituting the insulation dam 155 is addition curing type silicone based.

Meanwhile, depending on the type of material forming the shield pad 120 and the under-fill 153, the insulation dam 155 may be omitted. That is, if the insulating material forming the under-fill 153 is epoxy based when the conductive material forming the shield pad 120 is one of epoxy based, urethane based, or acrylic based, according to the type of the solvent included in the epoxy based of the insulating material, the under-fill 153 may not be mixed with the shield pad 120. Therefore, the insulation dam 155 may not be needed. In addition, if the insulating material forming the under-fill 153 is silicon-based when the conductive material forming the shield pad 120 is one of the epoxy based, the urethane based, and the acrylic based, the under-fill 153 may not be mixed with the shield pad 120 according to the type of the solvent included in the silicon based of the insulating material. Therefore, the insulation dam 155 may not be needed.

An electromagnetic interference shielding structure 104' shown in FIG. 10B is the same as the electromagnetic interference shielding structure 104 shown in FIG. 10A. However, there is a difference in that the lower portion 143a of the sidewall 143 of the shield can 140 is bent.

When the lower portion 143a of the sidewall 143 of the shield can 140 is bent, the contact area with the shield pad 120 may be increased, so that the shield can 140 may be more stably mounted on the shield pad 120, thereby improving the grounding efficiency.

FIG. 10B illustrates the lower portion 143a of the sidewall 143 of the shield can 140 is outwardly bent, but is not limited thereto. The lower portion 143a of the sidewall 143 of the shield can 140 may be inwardly bent. According to FIGS. 10A and 10B, the insulation dam 155 may be formed so as to be partly overlapped with the shield pad 120 when the circuit element 115 is disposed adjacent to the shield pad 120.

Figure 11:
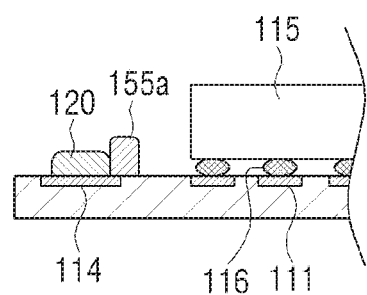
FIG. 11 is a partial cross-sectional view illustrating an example in which an insulation dam is formed in parallel to a shield pad without overlapping with the shield pad in the electromagnetic interference shielding structure; according to an embodiment of the disclosure

However, when a circuit element is disposed to have a predetermined distance from the shield pad 120, the insulation dam 155a may be formed in parallel to the shield pad 120 in contact to the inside of the shield pad 120 while not being overlapped with the shield pad 120 as shown in FIG. 11. The insulation dam 155a may be formed in parallel to the shield pad 120 with a predetermined distance therebetween so as to be spaced apart from the shield pad 120.

Figure 12A:
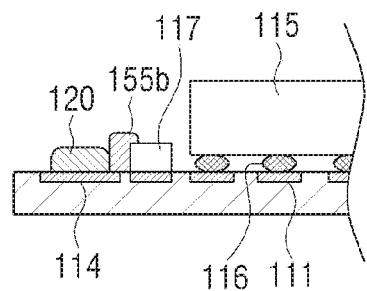
FIG. 12A is a partial cross-sectional view illustrating an example in which an insulation dam is formed between a passive element disposed adjacent to a shield pad and the shield pad in the electromagnetic interference shielding structure according to an embodiment of the disclosure.
Figure 12B:
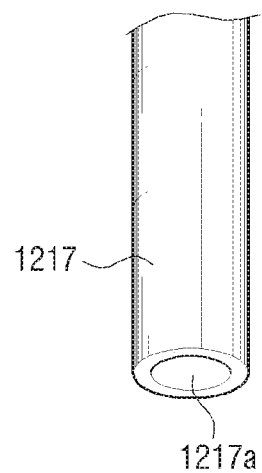
FIG. 12B is a perspective view illustrating the nozzle shown in FIG. 12A according to an embodiment of the disclosure.

Referring to FIG. 12A, when the circuit element 117 is interposed between the shield pad 120 and the circuit element 115, the insulation dam 115b may be formed between the shield pad 120 and the circuit element 117. The insulation dam 155b may be formed so as to be overlapped with the circuit element 117. In this case, a discharge port 1217a may be downwardly opened so that a second nozzle 1217 may discharge an insulating material downwardly as shown in FIG. 12B. It is desirable that the lower end of the second nozzle 1217 is on the shield pad 120 and the circuit element 117 not to be interrupted by the shield pad 120 and the circuit element 117 when the second nozzle 1217 moves while discharging an insulating material.

Figure 12C:
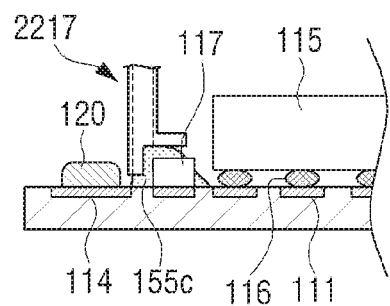
FIG. 12C is a partial cross-sectional view illustrating an example in which an insulation dam is formed to be overlapped with a passive element disposed adjacent to a shield pad in the electromagnetic interference shielding structure according to an embodiment of the disclosure.

Referring to FIG. 12C, when the circuit element 117 is disposed between the shield pad 120 and the circuit element 115, a part of the insulation dam 155c may be formed between the shield pad 120 and the circuit element 117, and the remaining of the insulation dam 155c may be overlapped with the circuit element 117. In this case, the second nozzle 2217 may be a nozzle that simultaneously discharges an insulating material downwardly or sideways toward the circuit element 117.

Figure 12D:
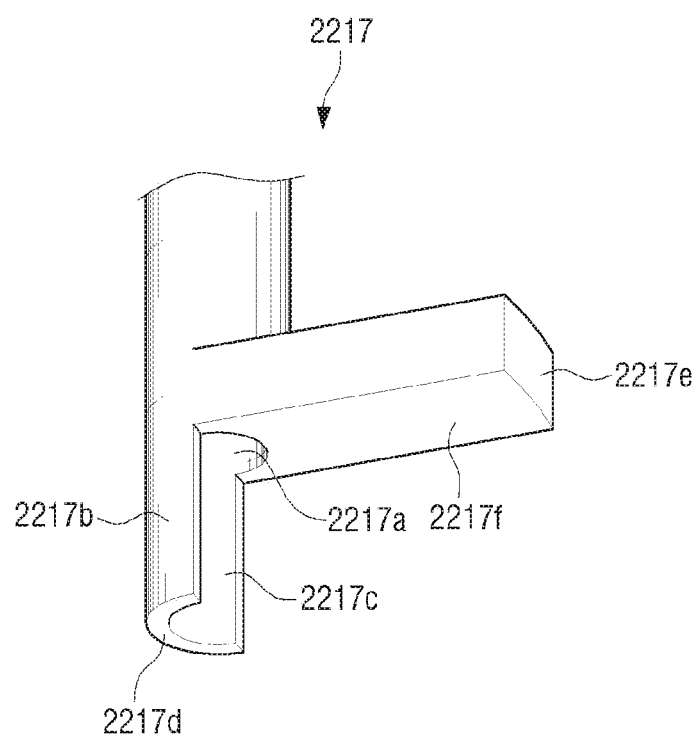
FIG. 12D is a perspective view illustrating the nozzle shown in FIG. 12C according to an embodiment of the disclosure.

Referring to FIG. 12D, a discharge port 2217a from which an insulating material is discharged may be formed on the bottom of the second nozzle 2217, and a side surface guide unit 2217b and an upper surface guide unit 2217e may be extended at the periphery of the discharge port 2217a.

The side surface guide unit 2217b may be downwardly extended along a length direction of the second nozzle 2217 from the lower end of the discharge port 2217a. The side surface guide unit 2217b may guide an insulating material discharged from the discharge port 2217a to move to the inside of the shield area. An inner circumferential surface 2217c of the side surface guide unit 2217b may be formed with a curved surface, but is not limited thereto, and the inner circumferential surface 2217c of the side surface guide unit 2217b may be formed with a flat surface.

A lower end 2217d of the side surface guide unit 2217b may be spaced apart from the upper surface of the printed circuit board 110 at a predetermined distance not to be interrupted by the upper surface of the printed circuit board 110 when the second nozzle 2217 moves along a movement path. When the second nozzle 2217 is set to a position for discharging, a height in a Z axis direction may be set considering a gap between the lower end 2217d of the side surface guide unit 2217b and the upper surface of the printed circuit board 110.

The upper surface guide unit 2217e may be downwardly extended from one side of the discharge port 2217a in a direction approximately perpendicular to a length direction of the second nozzle 2217.

The upper surface guide unit 2217e may guide an insulating material discharged from the discharge port 2217a to face the circuit element 117 together with the side surface guide unit 2217b so that a part of the insulation dam 155c may be overlapped with the circuit element 117.

A lower surface 2217f of the upper surface guide unit 2217e may be formed flat so as to be in parallel to the upper surface of the printed circuit board 110. Accordingly, a height of the insulation dam 155c may be limited.

Figure 13:
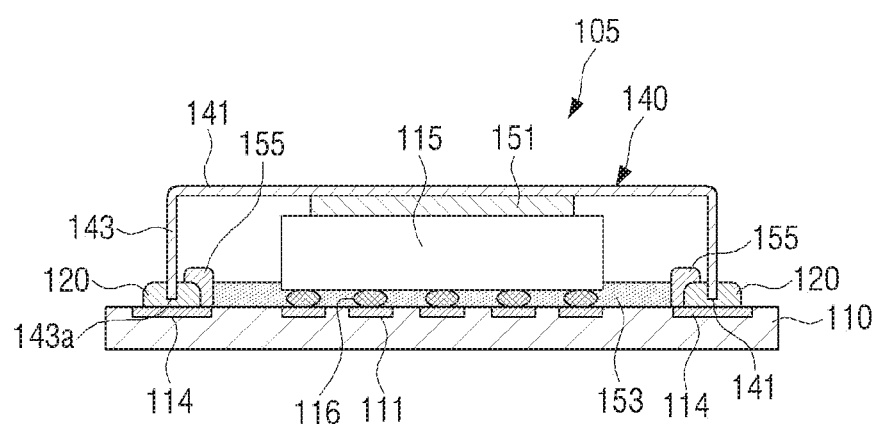
FIG. 13 is a cross-sectional view illustrating an embodiment in which a heat transfer member, an under-fill and an insulation dam are formed in the electromagnetic interference shielding structure shown in FIG. 1 according to an embodiment of the disclosure.

FIG. 13 is a cross-sectional view illustrating an embodiment in which a heat transfer member, an under-fill and an insulation dam are formed in the electromagnetic interference shielding structure shown in FIG. 1.

An electromagnetic interference shielding structure 105 shown in FIG. 13 may include an insulation dam 155, an under-fill 153 and a heat transfer member 151.

The heat transfer material forming the heat transfer material 151 may be applied to the upper surface of the circuit element 115 before or after the shield pad 120 is formed, before or after the insulation dam 155 is formed, or before or after the under-fill 153 is formed. In other words, the heat transfer material could be applied at any time if it is before the shield can 140 is mounted on the shield pad 120.

It is described that shield can 140 is fixed only by the shield pad 120, but the fixing force of the shield can 140 may be increased by a fixing force reinforcing member which is additionally formed. In this case, the fixing force reinforcing member may be formed of a shielding material or an insulting material.

Hereinafter, an example for additionally forming a fixing force reinforcing member will be described with reference to drawings.

Figure 14:
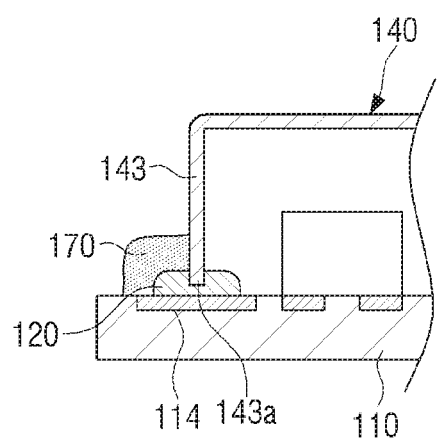
FIG. 14 is a cross-sectional view illustrating an example of covering a lower outer side of a shield pad and a shield can by using a fixing force reinforcing member to increase the fixing force of the shield can disposed on the shield pad according to an embodiment of the disclosure.

FIG. 14 is a cross-sectional view illustrating an example of covering a shield pad and a lower outer side of a shield can by using a fixing force reinforcing member to increase a fixing force of the shield can disposed on the shield pad.

Referring to FIG. 14, the fixing force reinforcing member 170 may cover both the sidewall 143 of the shield can 140 and the printed circuit board 110 so that the shield can 140 may be more firmly attached to the shield pad 120. To be specific, a part of the fixing force reinforcing member 170 may be attached to the lower portion of the sidewall 143, and the other part may be simultaneously attached to a portion outside the sidewall 143 of the upper portion of the shield pad 120 and the upper surface of the printed circuit board 110.

Accordingly, the shield can 140 may be firmly attached to the shield pad 120 since the area of attachment between the shield can 140 and the shield pad 120 may be indirectly increased through the fixing force reinforcing member 170.

The material forming the fixing force reinforcing member 170 may be a shielding material having an electrical conductivity as the shield pad 120, or the fixing force reinforcing member 170 may be formed of an insulating material as the insulation dam 155.

Figure 15:
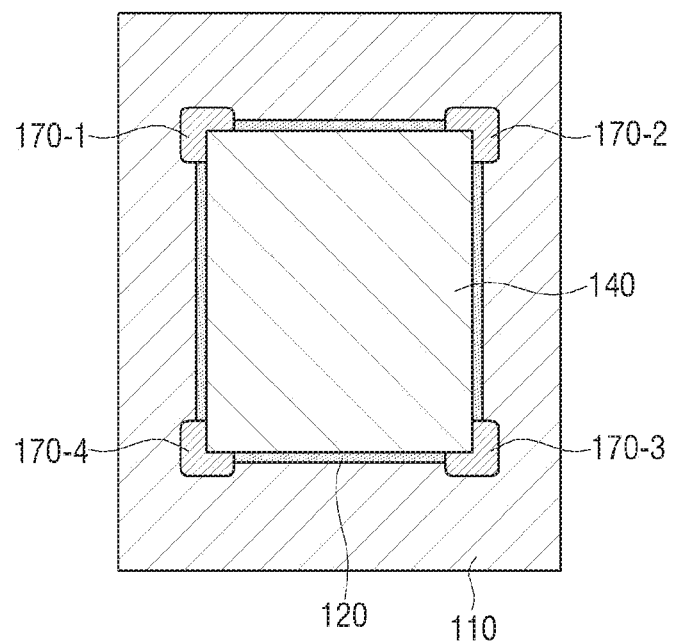
FIGS. 15 and 16 are plane views illustrating an example in which a fixing force reinforcing member is intermittently formed along the lower outer side of a shield can according to an embodiment of the disclosure.
Figure 16:
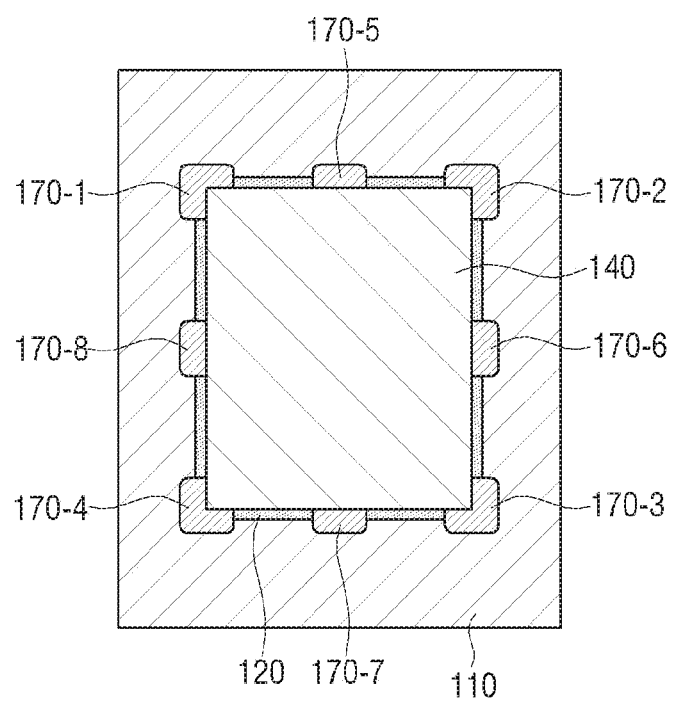
Figure 17:
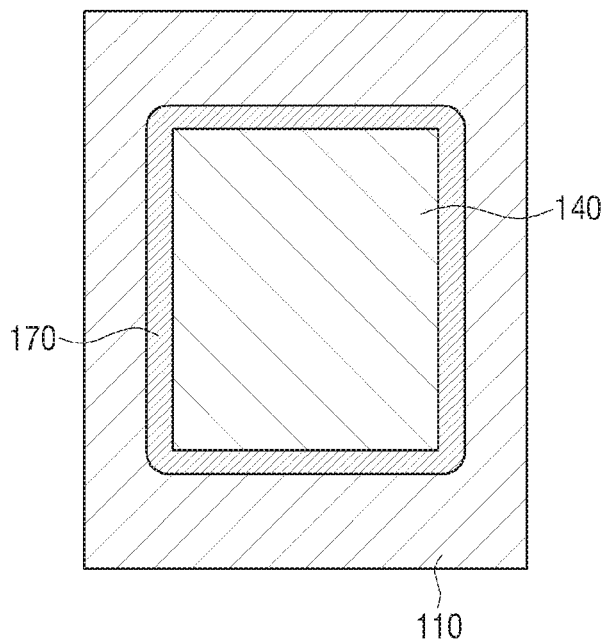
FIG. 17 is a plane view illustrating an example in which a fixing force reinforcing member is continually formed along the lower outer side of a shield can according to an embodiment of the disclosure.

FIGS. 15 and 16 are plane views illustrating an example in which a fixing force reinforcing member is intermittently formed along the lower outer side of a shield can, and FIG. 17 is a plane view illustrating an example in which a fixing force reinforcing member is continually formed along the lower outer side of a shield can.

Referring to FIG. 15, each of a plurality of fixing force reinforcing members 170-1, 170-2, 170-3 and 170-4 may be formed at each corner of the shield can 140. The plurality of fixing force reinforcing members 170-1, 170-2, 170-3 and 170-4 may simultaneously cover the corners of the shield can 140, the shield pad 120, and the upper surface of the printed circuit board 110 so that the shield can 140 may be firmly fixed to the shield can 120.

Referring to FIG. 16, the plurality of fixing force reinforcing members 170-1, 170-2, 170-3 and 170-4 may be formed respective corners of the shield can 140, and additional fixing force reinforcing members 170-5, 170-6, 170-7 and 170-8 may be formed between the corners. In this case, the shield can 140 may be firmly fixed to the shield pad 120 compared to an example of FIG. 15 where a fixing force reinforcing member is formed only at each corner.

Referring to FIG. 17, the fixing force reinforcing member 170 may be continually formed along the sidewall 143 of the shield can 140. In this case, the fixing force reinforcing member 170 may firmly attach the shield can 140 to the shield pad compared to the fixing force reinforcing members shown in FIGS. 15 and 16.

FIGS. 18 to 21 are views illustrating various embodiments of a cross-section of a nozzle discharging a fixing force reinforcing member.

Figure 18:
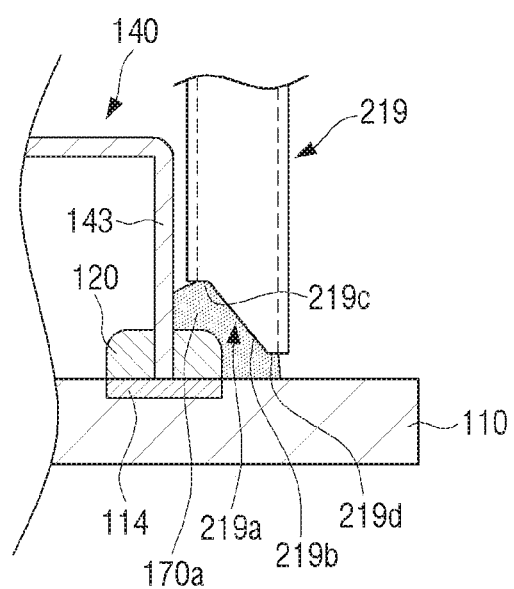
FIGS. 18, 19, 20, and 21 are views illustrating various examples of a cross-section of a nozzle discharging a fixing force reinforcing member according to an embodiment of the disclosure.

Referring to FIG. 18, a discharge port 219a from which a material having fluidity (a shielding material or an insulating material) is discharged at the lower end of a fourth nozzle 219. The fourth nozzle 219 may discharge a material to the discharge port 219a while moving along a Y axis direction. In this case, the material discharged from the discharge port 219a may be simultaneously discharged both in a side direction toward the outer side surface of the lower portion of sidewall 143 (−X axis direction) and a downward direction toward the printed circuit board 110 (−Z axis direction).

The discharge port 219a of the fourth nozzle 219 may include a diagonal unit 219b and an upper horizontal unit 219c and a lower horizontal unit 219d respectively extended from the upper end and the lower end of the diagonal unit 219b. The diagonal unit 219b, the upper horizontal unit 219c and the lower horizontal unit 219d may determine a cross-sectional shape of a fixing force reinforcing member 170a that is formed by the fourth nozzle 219 moving along a Y axis direction. In other words, a height of the fixing force reinforcing member 170a formed by the fourth nozzle 219 may be limited by the upper horizontal unit 219c, and a width thereof may be limited by the lower horizontal unit 219d.

The diagonal unit 219b may maintain a predetermined distance so that the discharge port 219a of the fourth nozzle 219 may not interfered by the shield pad 120 when the fourth nozzle 219 moves. Accordingly, the shield pad 120 formed by the fourth nozzle 219 may not be damaged. In addition, the lower horizontal unit 219d may maintain a predetermine distance not to be interfered by the upper surface of the printed circuit board 110 and cause the fourth nozzle 219 to easily move.

Hereinafter, discharge ports of fourth nozzles 1219, 2129 and 3129 shown in FIGS. 19 to 21 may be differently formed from the shape of the discharge port of the fourth nozzle 219 shown in FIG. 18.

Figure 19:
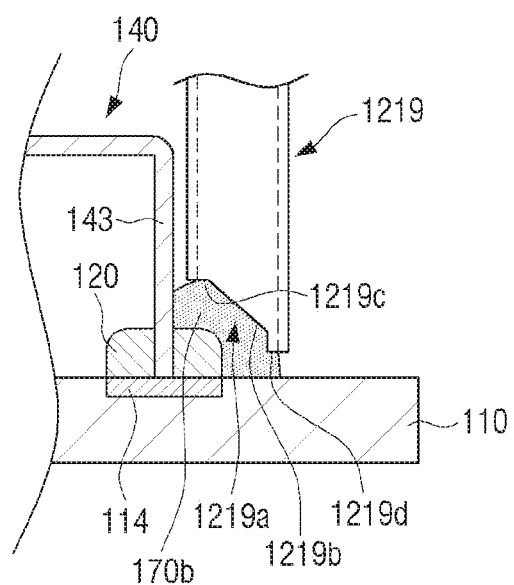

Referring to FIG. 19, the discharge port 1219a of the fourth nozzle 1219 may include the diagonal unit 1219b, the upper horizontal unit 1219c extending from the upper end of the diagonal unit 1219b, and the lower horizontal unit 1219d extending from the lower end of the diagonal unit 1219b.

The fixing force reinforcing member 170b may reduce a width of the fixing force reinforcing member 170b by a lower vertical unit 1219d.

Figure 20:
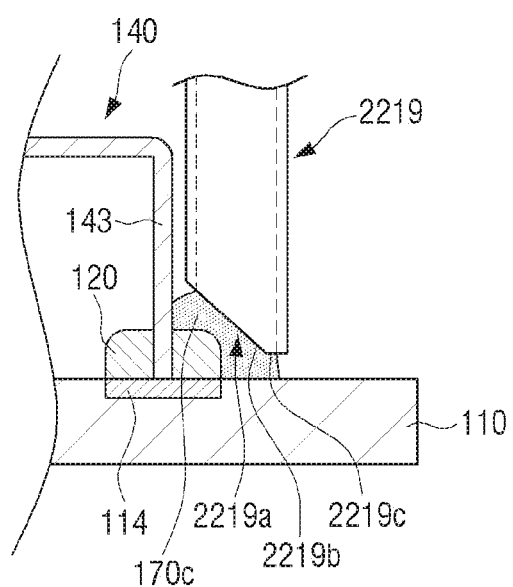

Referring to FIG. 20, the discharge port 2219a of the fourth nozzle 2219 may include a diagonal unit 2219b, and a lower horizontal unit 2219c extending from a lower end of the diagonal unit 2219b.

A fixing force reinforcing member 170c formed by the fourth nozzle 2219 may be formed higher than the fixing force reinforcing members 170a and 170b formed by the fourth nozzles 219 and 1219 including a discharge port including an upper horizontal unit. Accordingly, a contact area between the fixing force reinforcing member 170c and the sidewall 143 of the shield can 140 may be increased.

Figure 21:
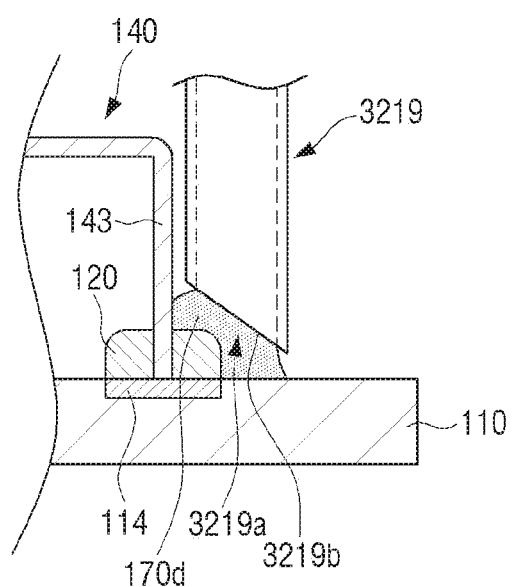

Referring to FIG. 21, a discharge port 3219a of a fourth nozzle 3219 may include only a diagonal unit 3219d.

A fixing force reinforcing member 170d formed by the fourth nozzle 3219 may be formed so as to have a greater height and a larger width than the fixing force reinforcing members 170c formed by the fourth nozzle 2219 shown in FIG. 20. Accordingly, the fixing force reinforcing member 170d may increase both the contact area between the sidewall 143 of the shield can 140 and the contact area between the printed circuit board 110, thereby ensuring a firm fixing force.

It is desirable that the fourth nozzles 219, 1219, 2219 and 3219 are formed so that a material can be simultaneously discharged downwardly or sideway and the discharged material (a shielding material or an insulating material) can be simultaneously applied to the printed circuit board and the side surface of the shield can, and an outer diameter of a nozzle is equal to or lower than 1.5 mm to eliminate interference between the material adjacent to the outer side of the shield can.

Figure 22:
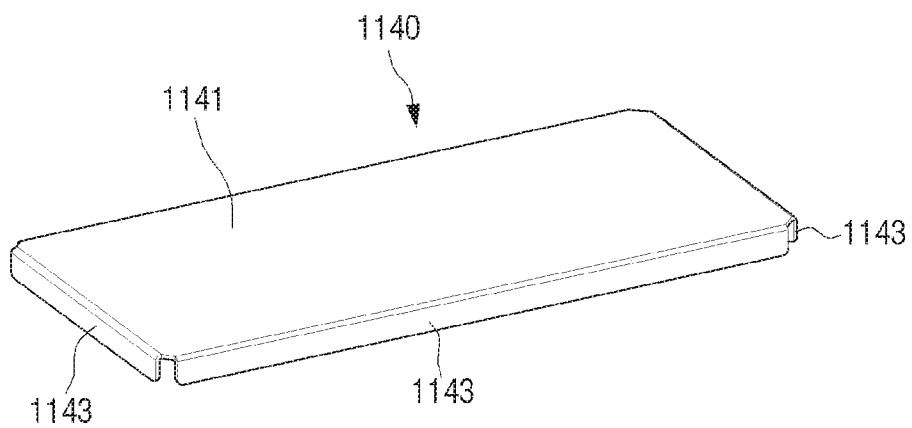
FIG. 22 is a perspective view illustrating an example in which a lower end of a sidewall of a shield can is linearly formed according to an embodiment of the disclosure.

FIG. 22 is a perspective view illustrating an example in which a lower end of a sidewall of a shield can is linearly formed.

Referring to FIG. 22, a shield can 1140 may include an upper plate 1141 and a plurality of sidewalls 1143 bent from an edge of the upper plate 1141. In this case, lower ends of the plurality of sidewalls may be linearly formed, not formed in an uneven shape, unlike a conventional shield can.

A shield can according to the related art may be fixed onto a printed circuit board by soldering and consist of a frame where a large area upper hole is formed for an under-fill and a rework process and two pieces of covers that open and close the upper hole. The lower end portion of a sidewall of the frame may have an uneven shape for easy soldering. When the shield can according to the related art which is fixed to the printed circuit board by soldering is formed by a single piece as the shield can 1140 according to an embodiment of the disclosure, elements on the printed circuit board may be deteriorated by hot air applied when the soldered shield is removed from the printed circuit board. Thus, a rework process may be difficult to perform. Therefore, according to the related art, a shield can is formed with a frame and two pieces of covers for an easy rework process.

The shield can 1140 according to an embodiment of the disclosure shown in FIG. 22 may be fixed to the printed circuit board by a shield pad and a fixing force reinforcing member formed through 3D printing. The shield pad and the fixing force reinforcing member may be easily removed from the printed circuit board by using a tool such as a spatula without applying heat. Therefore, the shield can 1140 may be formed by a single piece without a frame and two pieces of covers as the shield can according to the related art, which is fixed by soldering.

In addition, since the lower end portion of the shield can 1140 may not need to be formed in an uneven shape considering soldering, a manufacturing process of the shield can 1140 may be simplified and the number of processes may be reduced, thereby reducing the manufacturing cost.

While the disclosure has been shown described with reference to various embodiments thereof, it will be understood by those skilled in the art that various changes in form and details may be made therein without departing from the spirit and scope of the disclosure as defined by the appended and their equivalents.

What is claimed is:

1. An electromagnetic interference shielding structure, comprising:
    a shield pad configured to:
        surround at least one circuit element mounted on a printed circuit board, and
        be grounded to a ground pad formed on the printed circuit board;
    a shield can including:
        an upper plate; and
        a sidewall extending from the upper plate and partly embedded in the shield pad; and
    a heat transfer member formed on an upper surface of the at least one circuit element,
    wherein the heat transfer member is in contact with the upper plate of the shield can.

2. The electromagnetic interference shielding structure of claim 1, further comprising:
    an under-fill formed between the at least one circuit element and the printed circuit board.

3. The electromagnetic interference shielding structure of claim 2,
    wherein the shield pad comprises a conductive material, the conductive material forming the shield pad being addition cure type silicon based, and
    wherein the under-fill comprises an insulating material, the insulating material forming the under-fill being silicon based.

4. The electromagnetic interference shielding structure of claim 2,
wherein the shield pad comprises a conductive material, the conductive material forming the shield pad being one of epoxy-based, urethane-based, and acrylic-based, and
wherein the under-fill comprises an insulating material, the insulating material forming the under-fill being epoxy-based.

5. The electromagnetic interference shielding structure of claim 4, wherein a part of the insulation dam is overlapped with the shield pad.

6. The electromagnetic interference shielding structure of claim 2,
wherein the shield pad comprises a conductive material, the conductive material forming the shield pad being one of epoxy-based, urethane-based, and acrylic-based, and
wherein the under-fill comprises an insulating material, the insulating material forming the under-fill being silicon-based.

7. The electromagnetic interference shielding structure of claim 2, further comprising:
an insulation dam formed between the shield pad and the under-fill.

8. The electromagnetic interference shielding structure of claim 7, wherein the insulation dam is formed along the shield pad in parallel with the shield pad.

9. The electromagnetic interference shielding structure of claim 7,
wherein the shield pad comprises a conductive material, the conductive material forming the shield pad being addition cure type silicone based,
wherein the under-fill comprises an insulating material, the insulating material forming the under-fill being epoxy based, and
wherein the insulation dam comprises an insulating material, the insulating material forming the insulation dam being addition cure type silicon based.

10. The electromagnetic interference shielding structure of claim 7,
wherein the shield pad comprises a conductive material, the conductive material forming the shield pad being one of epoxy-based, urethane-based, and acrylic-based, and
wherein the under-fill comprises an insulating material, the insulating material forming the under-fill being epoxy-based.

11. The electromagnetic interference shielding structure of claim 7,
wherein the shield pad comprises a conductive material, the conductive material forming the shield pad being one of epoxy-based, urethane-based, and acrylic-based, and
wherein the under-fill comprises an insulating material, the insulating material forming the under-fill being silicon-based.

12. The electromagnetic interference shielding structure of claim 2, wherein the under-fill comprises an insulating material discharged from at least one nozzle.

13. The electromagnetic interference shielding structure of claim 1, further comprising:
a fixing force reinforcing member covering the sidewall of the shield can, the shield pad, and a partial upper surface of the printed circuit board.

14. The electromagnetic interference shielding structure of claim 13, wherein the fixing force reinforcing member comprise at least one of a shielding material or an insulating material.

15. The electromagnetic interference shielding structure of claim 13, wherein the fixing force reinforcing member is formed on at least one corner of the shield can.

16. The electromagnetic interference shielding structure of claim 13, wherein the fixing force reinforcing member is formed along the sidewall of the shield can with a predetermined distance.

17. The electromagnetic interference shielding structure as claim 13, wherein the fixing force reinforcing member is consecutively formed along the sidewall of the shield can.

18. The electromagnetic interference shielding structure of claim 1, wherein a lower end of the sidewall of the shield can is linearly formed.

* * * * *